US006923657B2

(12) United States Patent
Brown et al.

(10) Patent No.: US 6,923,657 B2
(45) Date of Patent: Aug. 2, 2005

(54) ELECTRICAL CONTACT WITH COMPLIANT TERMINATION LEADS

(75) Inventors: John Bossert Brown, Ann Arbor, MI (US); Matthew Richard McAlonis, Elizabethtown, PA (US); Justin Shane McClellan, Camp Hill, PA (US); David Charles Martin, Mechanicsburg, PA (US); Attalee S. Taylor, Palmyra, PA (US); Troy Everette Conner, York, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/624,415

(22) Filed: Jul. 22, 2003

(65) Prior Publication Data

US 2005/0020099 A1 Jan. 27, 2005

(51) Int. Cl.[7] .......................... H01R 12/00; H05K 1/00

(52) U.S. Cl. .......................................... 439/71; 439/72

(58) Field of Search ............................ 439/71, 72, 66, 439/68, 83

(56) References Cited

U.S. PATENT DOCUMENTS

| | | | | | |
|---|---|---|---|---|---|
| 5,611,698 | A | * | 3/1997 | Ito ............................. | 439/72 |
| 5,772,451 | A | * | 6/1998 | Dozier et al. ................. | 439/70 |
| 6,296,495 | B1 | * | 10/2001 | Wang et al. .................. | 439/71 |
| 2001/0012739 | A1 | * | 8/2001 | Grube et al. ................ | 439/862 |
| 2001/0015373 | A1 | * | 8/2001 | Olson .................... | 228/180.22 |

* cited by examiner

*Primary Examiner*—Chandrika Prasad

(57) ABSTRACT

An electrical contact is provided that includes a body configured to be held on a circuit board. The body of the contact is movable relative to the circuit board along at least a first axis of motion. The contact includes a contact portion joined with the body that is configured to engage an electrical component. The contact portion may include one or more contact beams. The contact further includes a termination lead joined to the body and having an outer end that is configured to be soldered to the circuit board. The termination lead extends from the body at an acute or right angle to the first axis of motion. The termination lead flexes about an arcuate path as the body of the contact shifts along the first axis of motion with respect to the circuit board.

23 Claims, 5 Drawing Sheets

ELECTRICAL CONTACT WITH COMPLIANT TERMINATION LEADS

BACKGROUND OF THE INVENTION

The present invention generally relates to a contact configured to be joined to a conductive member while being held in a housing. For example the contact may be carried in an electrical socket and soldered to a circuit board. More particularly, the present invention relates to a contact having termination leads that flex to accommodate movement between the contact, a conductive member and a housing holding the contact.

An example of an application in which contacts are held in a housing and joined to a conductive member is in electrical sockets that are generally used to connect processors to circuit boards. The typical socket includes a body having an array of cavities that carry contacts. One type of socket is a pin grid array (PGA) socket which holds contacts that each have a flexible planar body joined to a solder ball at one end and a semicircular collar at another end. The solder ball extends out of the socket cavity below a bottom surface of the socket and is soldered to an electrical trace on the circuit board. The collar is located proximate, but below, a top surface of the body and receives and engages a pin extending from the processor in order to electrically connect the processor to the circuit board.

Another type of socket is a land grid array (LGA) socket, which holds contacts that each have a flexible body formed with a contact beam at one end and a solder ball at another end. The contact beams extend upward beyond the top surface of the socket cavities, while solder balls extend downward beyond the bottom surface of the socket. The solder balls join the contacts to electrical traces on a circuit board. The processor has several contact pads on its bottom surface that are positioned on the socket with the contact pads engaging the contact beams. The processor vertically compresses the contact beams downward in order to electrically connect the processor contact pads to the circuit board.

Conventional socket contacts suffer from several drawbacks. The contacts, socket and the circuit board are different sizes and are made of different materials, and thus have differing coefficients of thermal expansion. The coefficient of thermal expansion determines the amount that a material expands and contracts as the material is heated and cooled. Hence, the contacts, the socket and the circuit board expand and contract at different rates as the surrounding temperature changes such as when the electronic device is first turned on and begins to warm up.

Also, during assembly, once the socket is placed on a circuit board, but before the processor is inserted, the solder balls must be liquefied sufficiently to solder each contact to a corresponding trace on the circuit board. This is achieved through a reflow solder process during which the socket and circuit board are passed through an oven and heated to a relatively high temperature. Upon completion of reflow soldering the solder balls are formed directly to the bodies of the contacts and the contacts in turn are held rigidly in the cavities of the socket. The solder balls rigidly join the contacts and traces on the circuit board. Thus, as the circuit board, contacts and socket expand at a different rates, the solder joints between the contacts and the circuit board are strained. When these strains become substantial, the solder joints may fracture.

The impact of the mismatch in the coefficients of thermal expansion is magnified by the use of large sockets carrying a large array of contacts. The socket expands and contracts evenly in all directions. Thus, cavities near the center of the socket move or shift laterally less than cavities near the outer perimeter of the socket. Also, for sockets with an opening through the center, cavities in the central portion of each side of the socket move or shift less than cavities near the ends or corners of each side. Hence, while the solder joints near the center of a large socket may only be slightly affected by differences in coefficients of thermal expansion, solder joints near the edge or corner are greatly impacted by the differences in coefficients of thermal expansion. Therefore, the most strain occurs at the solder joints near the perimeter of the socket and near the corners. The inability to accommodate for differences in coefficients of thermal expansion between the contacts, socket and the circuit board limits the use of large sockets.

A need exists for a socket and contact that address the above noted problems and others experienced heretofore.

BRIEF DESCRIPTION OF THE INVENTION

An electrical contact is provided that includes a body configured to be held on a circuit board. The body of the contact is movable relative to the circuit board along at least a first direction of motion. The contact includes a contact portion joined with the body that is configured to engage an electrical component. The contact portion may include one or more contact beams. The contact further includes a termination lead joined to the body and having an outer end that is configured to be fixedly secured to the circuit board. The termination lead extends from the body at a non-parallel angle to the first direction of motion, along which the contact moves relative to the circuit board. The termination lead flexes about an arcuate path as the body of the contact shifts along the first direction of motion with respect to the circuit board. The termination lead may also flex to permit relative motion between the circuit board and the body of the contact along a second direction of motion that is oriented at an angle to the first direction of motion.

Optionally, the body may be provided with a central beam that defines and extends along a longitudinal axis of the body. The termination lead extends laterally from the central beam at one of acute and right angles with respect to the longitudinal axis. A plurality of termination leads may be provided on the body and distributed such that a pair of termination leads are located near the center of the central beam and extend laterally outward therefrom. Optionally, termination leads may be provided at one end or at opposite ends of the central beam and also oriented to extend laterally outward therefrom.

In accordance with at least one alternative embodiment, an electrical socket is provided having a housing that is configured to be placed on a circuit board and to receive an electronic package, such as a processor or the like. The socket includes a contact having a body that is securely held in the housing where the body joints a termination lead. The termination lead has an outer end that is configured to be fixedly secured to the circuit board. The termination lead flexes when the housing of the socket shifts with respect to the circuit board. The housing may hold a plurality of contacts about the perimeter of the housing or evenly distributed across the housing. The contacts are shifted by different amounts with respect to the circuit board as the housing expands and contracts with changes in temperature.

Figure 1:
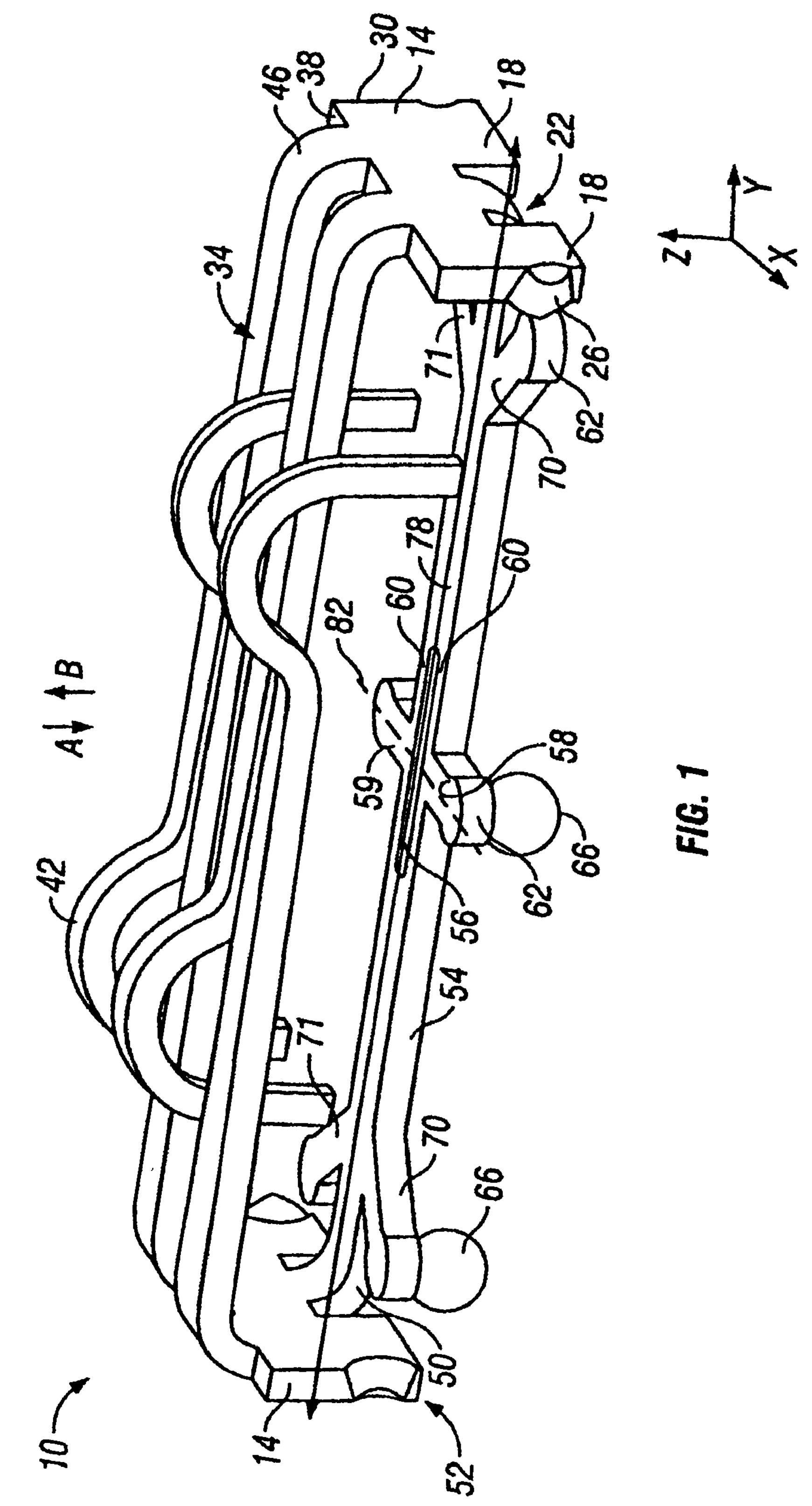
FIG. 1 illustrates a side isometric view of a contact formed in accordance with one embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

FIG. 1 illustrates an isometric view of a contact 10 formed according to an embodiment of the present invention. The contact 10 includes a central beam 54 that generally defines a body for the contact 10. The central beam 54 is joined with rectangular end walls 14 on opposite ends thereof. The contact 10 is generally made of a conductive material such as a copper alloy. The end walls 14 each include legs 18 divided by a gap 22. The end walls 14 have rounded retention barbs 26 on opposed outer surfaces 30. Each end wall 14 has at least on flexible contact beam 34 that projects from a top edge 38 of the end wall 14. The contact beams 34 are bent to extend toward the opposite end wall 14. As shown in FIG. 1, the contact beams 34 are oriented parallel to one another along a longitudinal axis 78 of the contact 10. Each contact beam 34 has an elbow 46 at one end that is formed with the end wall and has a contact arch 42 at an opposite end. Each contact beam 34 may be flexed about the elbow 46 in the directions of arrows A and B. The contact beams 34 extend from opposite end walls 14 and are interleaved with each other such that a contact beam 34 extending from one end wall is located between contact beams 34 extending from the other end wall 34, and vice versa.

Figure 2:
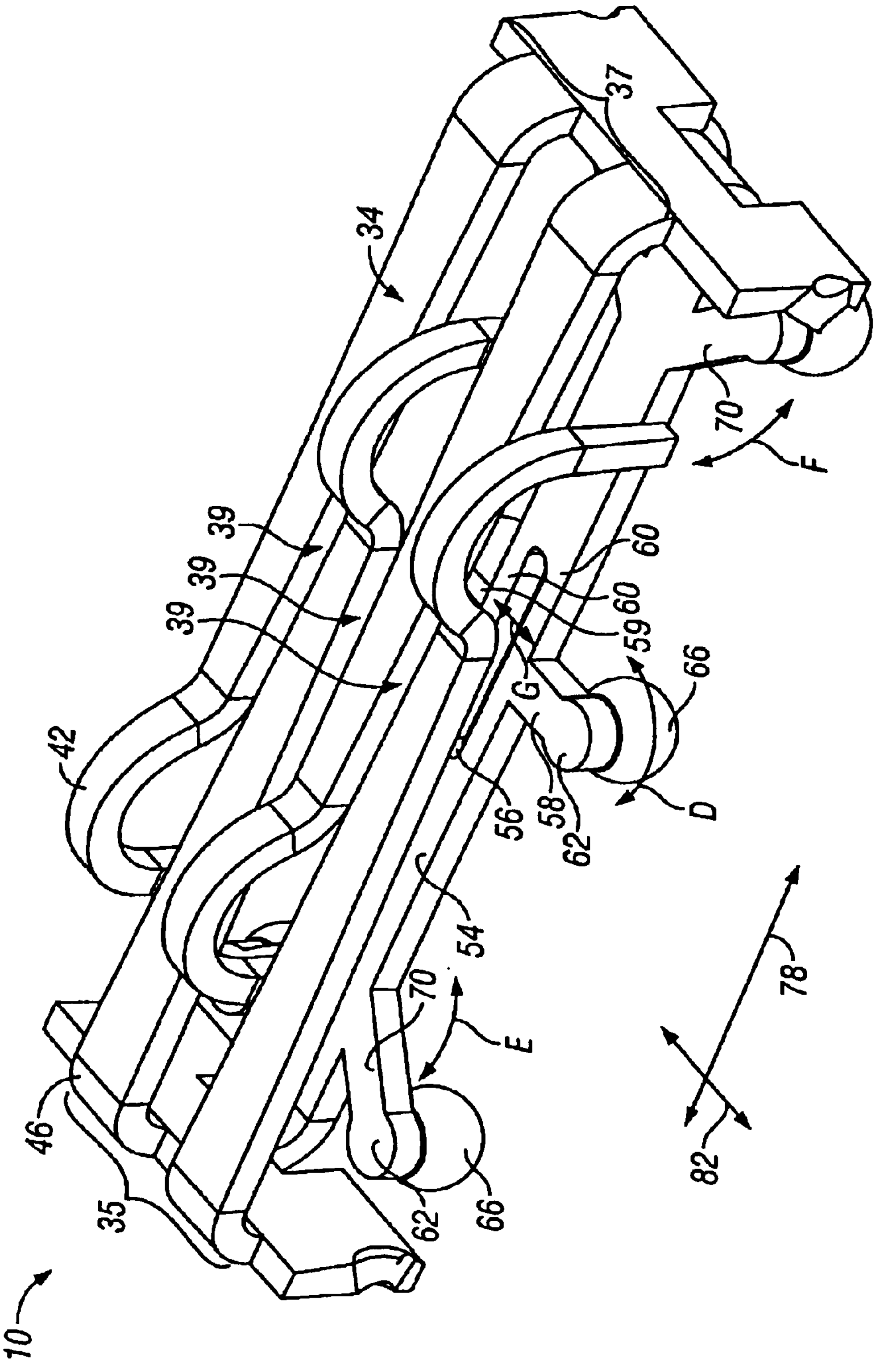
FIG. 2 illustrates a top isometric view of the contact of FIG. 1.

Optionally, the contact 10 may include only a single contact beam 34 and a single end wall 14. Alternatively, more than two contact beams 34 may be formed with each end wall 14. Alternatively, an uneven number of contact beams 34 may be used (e.g., one contact beam 34 on one end wall 14 and two or three contact beams 34 on the opposite end wall 14). Each end wall 14 has a curved arm 50 extending from a bottom end 52 between the legs 18. The curved arms 50 are formed with a thin center beam 54. The center beam 54 extends parallel to the longitudinal axis 78 between the end walls 14. The center beam 54 includes a slot 56 cut in the center thereof to form thin side walls 60 on opposite sides of the slot 56. The center beam 54 includes center termination leads 58 and 59 extending perpendicularly from opposite sides of the center beam 54 along a transverse axis 82. The center termination leads 58 and 59 are formed with circular pads 62 on outer ends thereof that carry solder balls 66 (only one of which is shown in FIG. 1). End termination leads 70 and 71 are provided on opposite ends of the center beam 54 proximate the end walls 14. The end termination leads 70 and 71 extend laterally from the center beam 54 at an acute angle, such as a generally 45 degree angle, to the longitudinal axis 78 and toward the nearest end wall 14. The end termination leads 70 and 71 also are formed with circular pads 62 that carry the solder balls 66 (FIG. 2). Thus, the contact 10 retains several solder balls 66 for the purpose of forming solder joints with a common pad or trace on the printed circuit board 74 (not shown when reflow soldered). The center termination leads 58 and 59 and the end termination leads 70 and 71 retain the solder balls 66 remote from the center beam 54 and the end walls 14.

FIG. 2 further illustrates the contact 10 of FIG. 1 at a different orientation to better show the relative alignment of the contact beams 34. As shown in FIG. 2, each contact beam 34 is tapered with a wide base portion proximate elbows 46 and a narrow end portion proximate contact arches 42. The contact beams 34 are arranged in contact pairs 35 and 37 facing in opposite directions.

Figure 3:
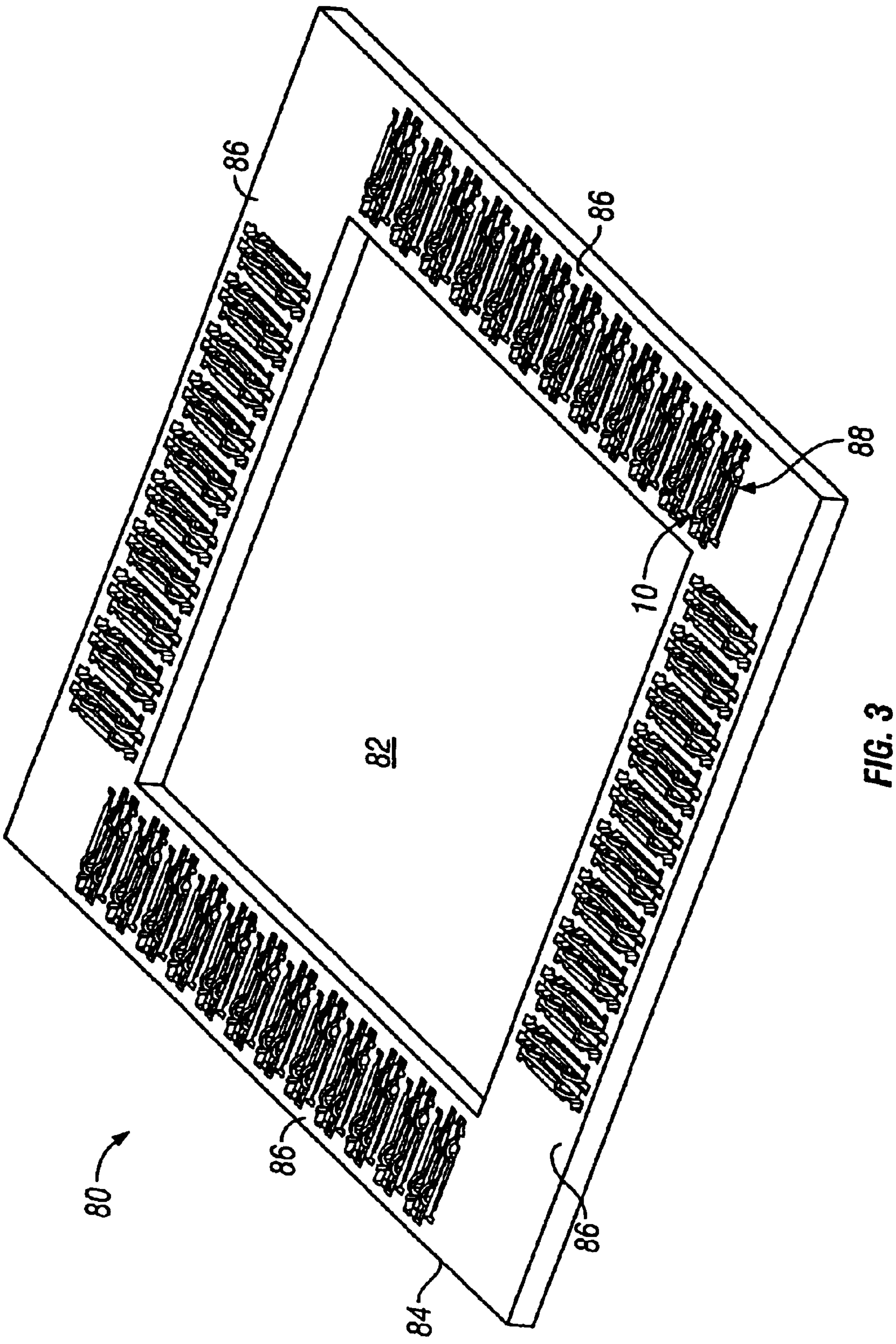
FIG. 3 illustrates an isometric view of a socket containing a plurality of contacts in accordance with an embodiment of the present invention.

FIG. 3 illustrates an isometric view of an electrical socket 80 having an opening 82 through the center thereof. The socket 80 includes a housing 84 which is comprised of side portions 86. Each side portion 86 includes at least one row of cavities 88 that are arranged side by side and oriented to extend toward the opening 82 proximate the center of the socket 80. Each cavity 88 receives a corresponding contact 10.

Figure 4:
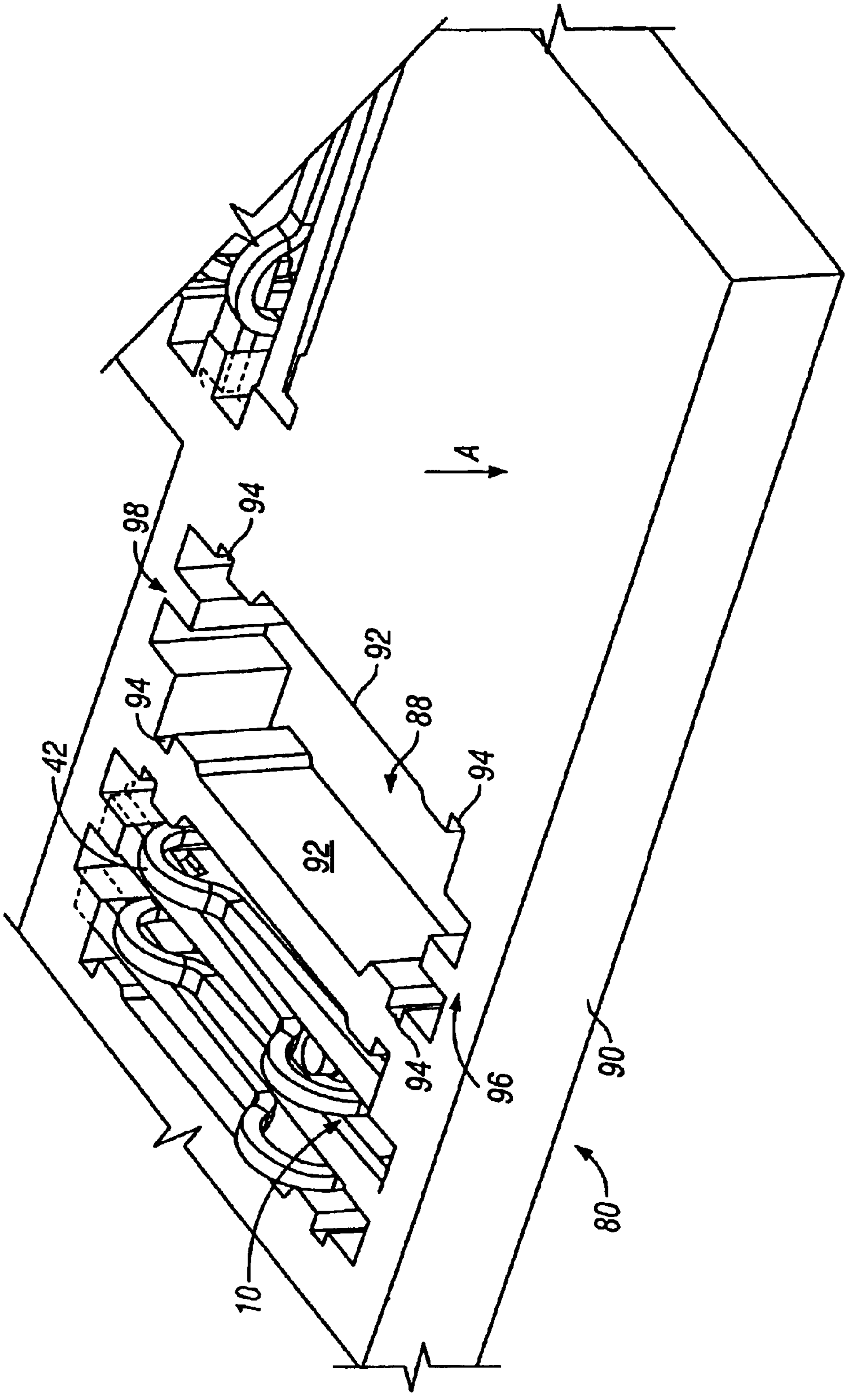
FIG. 4 illustrates an exploded, partial enlarged view of a section of the socket of FIG. 3 with a contact removed from a cavity in the housing in accordance with an embodiment of the present invention.

FIG. 4 illustrates an enlarged portion of the socket 80 to better show a cavity 88 and a contact 10 once loaded into the cavity 88. Each cavity 88 is oriented perpendicular to the edge 90 of the socket 80. The cavity 88 includes side walls 92 that have notches 94 cut therein. The notches 94 are arranged in pairs and aligned across from one another. The notches 94 are positioned proximate opposite ends 96 and 98 of the cavity 88. The notches 94 are positioned proximate opposite ends 96 and 98 of the cavity 88. The notches 94 are configured to receive the retention barbs 26 (FIG. 1) formed along the opposite outer surfaces 30 of the end walls 14 of the contact 10. The retention barbs 26 securely engage the notches 94 to retain the contacts 10 in place.

Once the contacts 10 are inserted into the cavities 88 in the housing 84 of the socket 80, the socket 80 is then positioned on a circuit board and the solder balls 66 (FIG. 2.) are soldered to electrical traces on the circuit board. A processor (not shown) is then positioned on the socket 80 such that contact pads on the processor are aligned with, and engage, the contact arches 42.

Returning to FIG. 1, the compression of the processor on the contact arches 42 in the direction of arrow A flexes the contact beams 34 about the elbows 46. The processor and circuit board are thus indirectly electrically connected as the electrical signals travel from the contact arches 42 along the contact beams 34 to the end walls 14, and through the center beam 54, center and end termination leads 58, 59, 70 and 71, and solder balls 66.

Because the socket 80 and circuit board are made of insulating materials such as plastic and the contact 10 is made of a conductive material such as copper, the socket 80, the circuit board and the contact 10 have different coefficients of thermal expansion. As the surrounding temperature changes, the contacts 10, the socket 80 and the circuit board expand or contract at different rates and by different amounts.

Thus, the contacts 10 shift with respect to the circuit board along the longitudinal and transverse axes 78 and 82 (FIG. 1).

With reference to FIG. 2, the center termination leads 58 and 59 function as cantilever beams that flex in the direction of arrow D with movement or shifts between the contact 10 and the circuit board in either direction along the longitudinal axis 78. The slot 56 permits the side walls 60 to bow or flex in the directions denoted by arrow G. The center termination leads 58 and 59 are thus permitted to translate or shift along their lengths in the direction of arrow G as the side walls 60 bow, thereby permitting transverse or lateral movement or shifting to occur between the circuit board and the pads 62 on the center termination leads 58 and 59. Therefore, as the contact 10, socket 80 and circuit board expand or contract by different amounts along the longitudinal axis 78 and/or transverse axis 82, less strain is applied to the solder joints at the pads 62. The end termination leads 70 and 71 function as cantilever beams that flex in the directions of arrows E and F with longitudinal and transverse movement or shifts between the contact 10 and the circuit board. The end termination leads 70 and 71 are oriented at an acute angle to the center beam 54 and thus permit movement between the contact 10 and circuit board along the longitudinal axis 78, as well as along the transverse axis 82.

Optionally, the center termination leads 58 and 59 may be modified to extend at an acute angle from the center beam 54 with the slot 56 retained or removed. Alternatively, the end termination leads 70 and 71 may be oriented at a perpendicular angle to the center beam 54, with a slot (similar to slot 56) provided within the center beam 54 to permit transverse movement or shifting at the end termination leads 70 and 71.

Optionally, the center and end termination leads 58 and 59 and 70 and 71 may be formed at alternative angles or in varied combinations (e.g., less than 6 leads or more than 6 leads). Alternatively, an uneven number of termination leads may be provided. Alternatively, termination leads may be provided at different positions along the length of the center beam 54.

Figure 5:
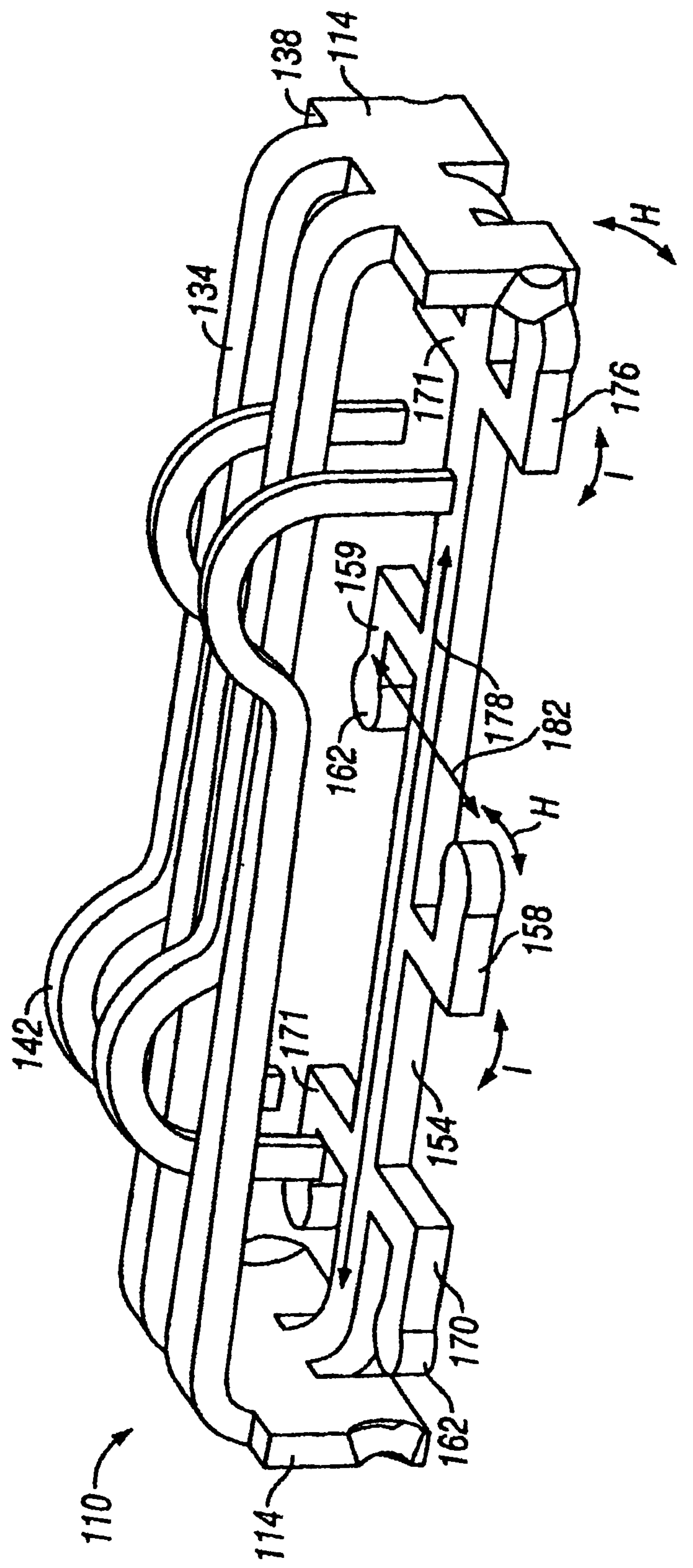
FIG. 5 illustrates a contact formed in accordance with an alternative embodiment.

FIG. 5 illustrates a contact 110 formed in accordance with an alternative embodiment. The contact 110 includes end walls 114 that are joined by a center beam 154. The end walls 114 also include contact beams 134 that extend from the top ends 138 of the end walls 114 and are bent toward one another and offset to overlap in an interleaved manner. Each contact beam 134 includes a contact arch 142 proximate the outer end thereof. The center beam 154 includes termination leads 158 and 159 extending laterally from opposite sides of the center beam 154. The termination leads 158 and 159 are located at intermediate points along the length of the center beam 154 and are slightly offset from one another and are bent in an L-shape to face in opposite directions parallel to a longitudinal axis 178 of the contact 110. Termination leads 170 and 171 are also provided at opposite ends of the center beam 154 and extend outward laterally from either side of the center beam 154. The termination leads 170 and 171 are bent in an L-shape and are oriented to face the end walls 114.

In the embodiment of FIG. 5, the termination leads 158, 159, 170 and 171 are formed in an L-shape with the base of the L-shaped portion joining the sides of the center beam 154. Outer ends of the L-shaped portion of the termination leads 158, 159, 170 and 171 include circular pads 162 that are configured to retain solder balls (not shown) in a manner similar to that explained above in connection with the contact of FIG. 1. By forming each termination lead 158, 159, 170 and 171 in an L-shape, they are able to flex in two directions (namely in the transverse and longitudinal directions denoted by arrows H and I) to permit shifting between the circuit board (not shown) and the contact 110 in the direction of the longitudinal axis 178 and the transverse axis 182.

It is to be understood that the contacts 10 and 110 may be used with many other conductive members besides circuit boards, sockets and processors.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An electrical contact, comprising:

a body configured to be placed on a first conductive member and to move relative to the first conductive member along a first axis of motion, wherein said body includes a central beam defining and extending along a longitudinal axis of said body, said longitudinal axis extending along a surface of the first conductive member;

a contact portion joined with said body, said contact portion being configured to engage a second conductive member; and a termination lead having a base end joined to said central beam and having an opposite outer end configured to be fixed securely to the first conductive member, said termination lead extending laterally from said central beam at one of acute and right angles with respect to said longitudinal axis, said termination lead flexing with respect to said body to permit relative movement between said body and the first conductive member along said first axis of motion.

2. The electrical contact of claim 1, wherein said central beam extends parallel to said first axis of motion along a surface of the first conductive member, and said termination lead extends at an acute angle from said body and flexes about an arcuate path as said body moves along said first axis of motion.

3. The electrical contact of claim 1, wherein said base end is formed integral with a side wall of said central beam, said side wall bowing to permit said termination lead to translate along said first axis of motion.

4. The electrical contact of claim 1, wherein a plurality of said termination leads extend laterally from opposite sides of said central beam in directions transverse to said longitudinal axis, said central beam and said termination leads being arranged in a common plane extending parallel to a surface of the first conductive member.

5. The electrical contact of claim 1, further comprising a plurality of said termination leads located proximately a center and opposite ends of said central beam.

6. The electrical contact of claim 1, wherein said central beam has a central slot cut therein to form side walls on opposite sides of said slot, said slot and side walls extending parallel to said longitudinal axis of said central beam, said termination lead being formed integral with one of said side walls and extending transverse to said longitudinal axis.

7. The electrical contact of claim 1, wherein said termination lead is L-shaped with said base end of said termination lead being formed with said central bean, said termination lead and said central beam being arranged in a common plane.

8. The electrical contact of claim 1, wherein said body includes an end wall configured to be securely held in an electrical socket, said end wall having opposite first and second edges such that an end of said control beam is formed with said first edge of said end wall and an end of said contact portion is formed with said second edge of said end wall, said central beam and said contact portion extending in a common direction from said end wall.

9. The electrical contact of claim 1, wherein said contact portion includes a plurality of contact beams interleaved with one another and extending toward one another from opposite ends of said body.

10. An electrical socket, comprising:

a housing configured to be placed on a circuit board and to receive an electronic component; and a contact having a body with an end wall securely held in said housing, said end wall having opposite first and second edges, said body including a central beam formed at one end with said first edge and extending from said end wall along a longitudinal axis of said central beam, said body including a termination lead formed with said central beam and extending transverse from said longitudinal axis, said termination lead having an outer end configured to be fixedly secured to the circuit board, said termination lead flexing with respect to said body when said housing shifts with respect to the circuit board along said longitudinal axis.

11. The electric socket of claim 10, wherein said housing holds a plurality of said contacts that shift by different amounts with respect to the circuit board as said housing expands and contracts due to changes in temperature.

12. The electrical socket of claim 10, wherein said termination lead flexes along an arcuate path in a plane parallel to a surface of the circuit board to permit said body to move relative to the circuit board along first and second directions of motion that are perpendicular to one another parallel to the surface of the circuit board.

13. The electrical socket of claim 10, wherein said termination lead extends laterally from said central beam at one of acute and right angles with respect to said longitudinal axis, said central beam and said termination lead extending parallel to a bottom surface of said housing.

14. The electrical socket of claim 10, wherein a plurality of said termination leads project laterally from said central beam.

15. The electrical socket of claim 10, further comprising a plurality of said termination leads located proximate a center and opposite ends of said central beam.

16. The electrical socket of claim 10, wherein said central beam has a slot cut therein to form a side wall, said termination lead joining said side wall, said side wall flexing to permit said termination lead to translate along a length of said termination lead.

17. The electrical socket of claim 10, wherein said termination lead is L-shaped and oriented with said outer end extending parallel to said longitudinal axis of said contact.

18. The electrical socket of claim 10, wherein said outer end of said termination lead includes a pad containing a solder ball that is configured to be soldered to the circuit board.

19. The electrical socket of claim 10, further comprising a plurality of termination leads, each of which has an outer end containing a solder ball, said solder balls being configured to be soldered to a circuit board to afford multiple points of connection between said contact and a circuit board.

20. An electrical contact, comprising:

a body configured to be placed on a first conductive member and to move relative to the first conductive member along a first axis of motion;

a plurality of contact beams joined with said body, said contact beams being configured to engage a second conductive member, wherein said contact beams extend from opposite ends of said body toward one another, said contact beams being held in an interleaved manner with one another; and a termination lead joined to said body, said termination lead having an outer end configured to be fixed securely to the first conductive member, said termination lead being movable with respect to said body to permit relative movement between said body and the first conductive member along said first axis of motion.

21. An electrical contact, comprising:

a body having a central beam and an end wall, said end wall being configured to be securely held in an insulated housing, said end wall having opposite first and second edges, said central beam having an end formed with said first edge of said end wall, said central beam being configured to be placed on a first conductive member and to move relative to the first conductive member along a first axis of motion;

a contact beam having a first end formed with said second edge of said end wall, said contact beam having a second end configured to engage a second conductive member, said contact beam and said central beam extending in a common direction from said end wall; and a termination lead joined to said body, said termination lead having an outer end configured to be fixed securely to the first conductive member, said termination lead being movable with respect to said body to permit relative movement between said body and the first conductive member along said first axis of motion.

22. The electrical contact of claim 21, wherein said termination lead includes a base end formed integral with a side wall of said central beam, said side wall bowing to permit said termination lead to translate along said first axis of motion.

23. The electrical contact of claim 21, wherein a plurality of said termination leads extend laterally from opposite sides of said central beam in directions transverse to said longitudinal axis, said central beam and said termination leads being arranged in a common plane extending parallel to a surface of the first conductive member.

* * * * *